(12) United States Patent
Speckbacher et al.

(10) Patent No.: US 6,621,104 B1
(45) Date of Patent: Sep. 16, 2003

(54) INTEGRATED OPTOELECTRONIC THIN-FILM SENSOR AND METHOD OF PRODUCING SAME

(75) Inventors: Peter Speckbacher, Kirchweidach (DE); Dieter Michel, Traunstein (DE)

(73) Assignee: Dr. Johannes Heidenhain GmbH, Traunreut (DE)

( * ) Notice: Subject to any disclaimer, the term of this patent is extended or adjusted under 35 U.S.C. 154(b) by 0 days.

(21) Appl. No.: 09/959,357

(22) PCT Filed: Apr. 18, 2000

(86) PCT No.: PCT/EP00/03509
§ 371 (c)(1), (2), (4) Date: Feb. 15, 2002

(87) PCT Pub. No.: WO00/63654
PCT Pub. Date: Oct. 26, 2000

(30) Foreign Application Priority Data

Apr. 21, 1999 (DE) .......................... 199 17 950

(51) Int. Cl.$^7$ ............................................... H01L 27/15
(52) U.S. Cl. ........................... 257/80; 257/82; 257/84; 438/24; 438/25; 438/26; 438/27; 250/237 G
(58) Field of Search ................ 257/80, 82, 84, 257/98, 432, 437; 250/237 G, 231.16, 237.14; 438/22, 24–27, 29; 356/356, 354

(56) References Cited

U.S. PATENT DOCUMENTS

| | | | |
|---|---|---|---|
| 4,051,367 A | 9/1977 | Sayce, deceased et al. | |
| 4,923,300 A | 5/1990 | Michel et al. | |
| 4,938,595 A | 7/1990 | Parriaux et al. | |
| 5,001,340 A | 3/1991 | Schwefel et al. | |
| 5,055,894 A | * 10/1991 | Chan ............... | 357/19 |
| 5,113,066 A | 5/1992 | Michel et al. | |
| 5,155,355 A | 10/1992 | Kabaya | |
| 5,162,869 A | 11/1992 | Michel et al. | |
| 5,271,078 A | 12/1993 | Franz et al. | |
| 5,302,820 A | 4/1994 | Henshaw et al. | |
| 5,485,021 A | 1/1996 | Abe | |
| 5,493,397 A | 2/1996 | Huber et al. | |
| 5,519,247 A | * 5/1996 | Arbus et al. ............... | 257/437 |
| 5,742,391 A | 4/1998 | Kaneda et al. | |
| 5,774,219 A | 6/1998 | Matsuura | |
| 5,852,322 A | 12/1998 | Speckbacher | |

FOREIGN PATENT DOCUMENTS

| | | |
|---|---|---|
| DE | 25 11 350 | 10/1975 |
| DE | 40 91 517 | 8/1991 |
| DE | 195 24 725 | 7/1996 |
| DE | 195 24 725 C1 * | 11/1996 |
| DE | 196 18 593 | 11/1996 |
| DE | 197 01 941 | 7/1997 |

(List continued on next page.)

OTHER PUBLICATIONS

Patent Abstracts of Japan, published by European Patent Office, vol. 18, No. 673 (E–1647), Feb. 4, 1998, regarding Japanese published application 06268254, published Sep. 22, 1994.

Pending Patent Application Assigned to Dr. Johannes Heidenhain GmbH: Ser. No.: 09/993,944, Filing Date: Nov. 14, 2001, Inventor: Holzapfel et al.

Primary Examiner—Tom Thomas
Assistant Examiner—Donghee Kang
(74) Attorney, Agent, or Firm—Brinks Hofer Gilson & Lione

(57) ABSTRACT

A measuring system that includes a scale and a transparent substrate located opposite the scale. The transparent includes a graduation structure and a semiconductor layer arranged on a first side of the transparent substrate facing away from the scale, wherein a photodetector, a light source and an electronic circuit are integrated into the semiconductor layer.

29 Claims, 6 Drawing Sheets

FOREIGN PATENT DOCUMENTS

| | | |
|---|---|---|
| DE | 197 20 300 | 12/1997 |
| DE | 198 59 669 | 6/2000 |
| DE | 198 59 670 | 6/2000 |
| EP | 0 543 513 | 5/1993 |
| EP | 0 630 057 | 12/1994 |
| EP | 0 720 005 | 7/1996 |
| EP | 1 014 034 | 6/2000 |
| GB | 1 504 691 | 3/1978 |
| GB | 2 315 594 | 2/1998 |
| JP | 6-268254 | 9/1994 |

* cited by examiner

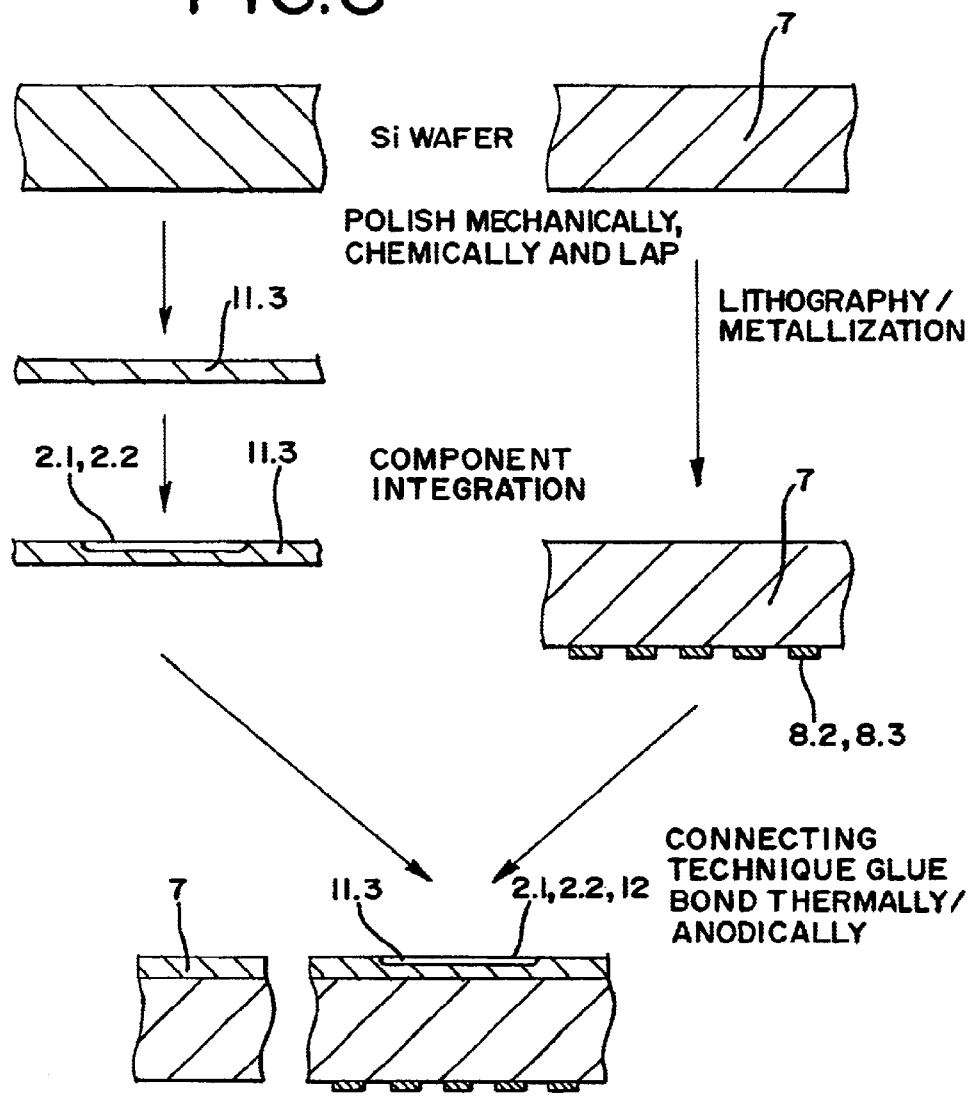

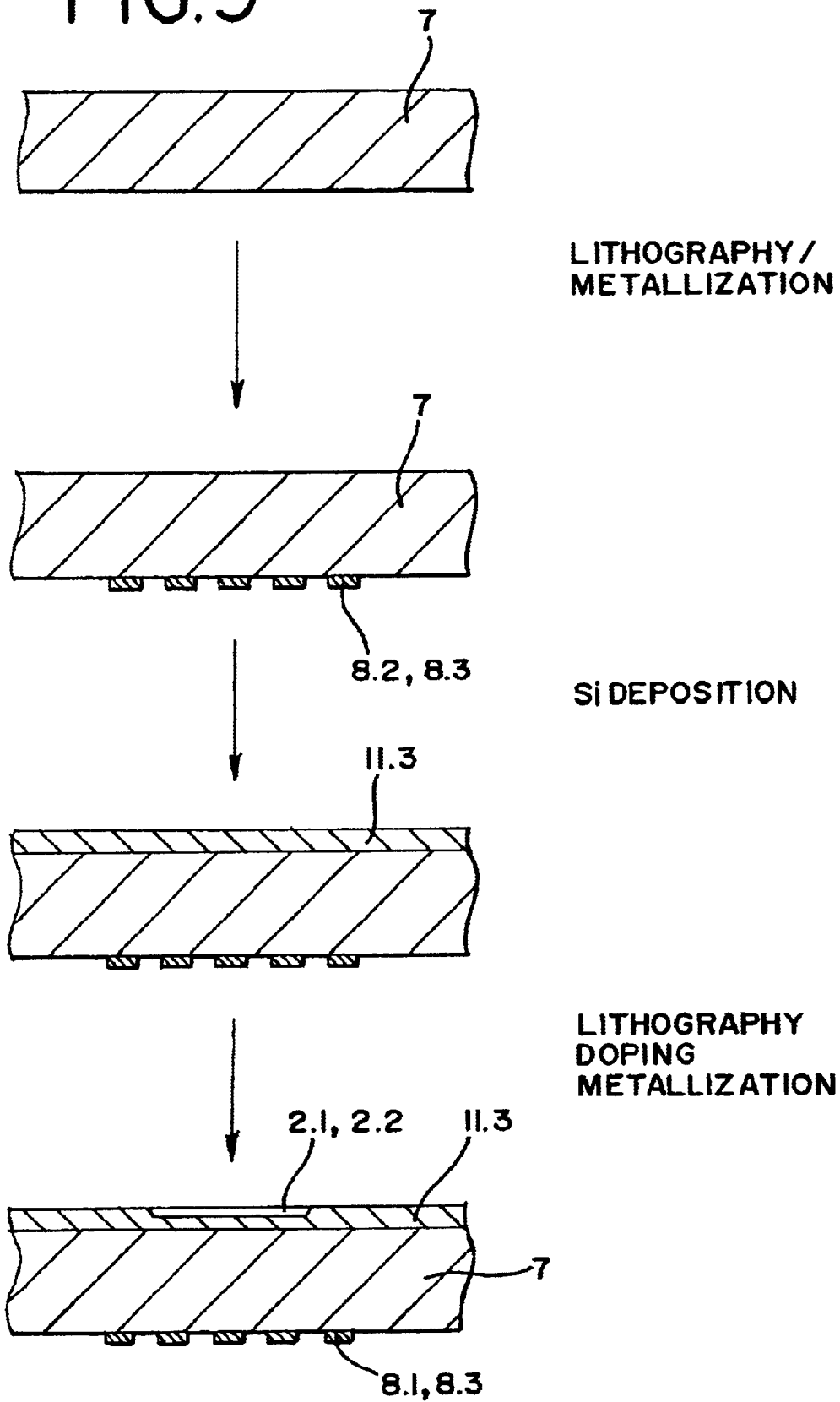

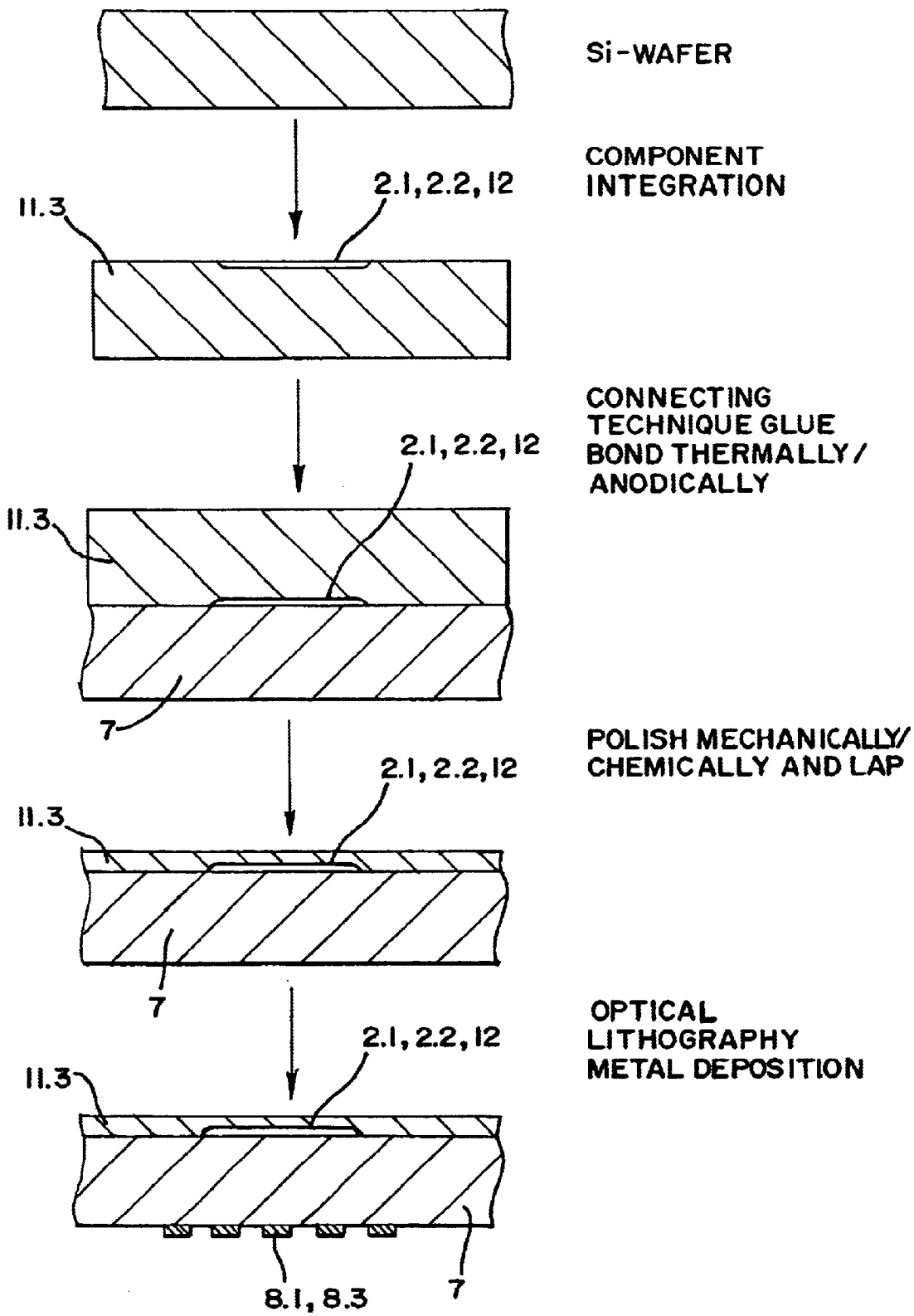

INTEGRATED OPTOELECTRONIC THIN-FILM SENSOR AND METHOD OF PRODUCING SAME

Applicants claim, under 35 U.S.C. §§120 and 365, the benefit of priority of the filing date of Apr. 18, 2000 of a Patent Cooperation Treaty patent application, copy attached, Ser. No. PCT/EP00/03509, filed on the aforementioned date, the entire contents of which are incorporated herein by reference, wherein Patent Cooperation Treaty patent application Ser. No. PCT/EP00/03509 was not published under PCT Article 21(2) in English.

Applicants claim, under 35 U.S.C. §119, the benefit of priority of the filing date of Apr. 21, 1999 of a German patent application, copy attached, Ser. No. 199 17 950.6, filed on the aforementioned date, the entire contents of which are incorporated herein by reference.

BACKGROUND OF THE INVENTION

1. Field of the Invention

The present invention relates to an integrated optoelectronic thin-film sensor for a measuring system, and a method for producing it.

2. Description of the Related Art

A measuring system is known from GB 1,504,691 and corresponding DE 25 11 350 A1, wherein the displacement of a first component in relation to a second component is a determined. Two gratings are provided for this, which are at a constant distance from each other and each one of which is respectively fastened on one component. If the second grating is illuminated with divergent light, the first grating generates a periodic image of the second grating, which image moves if there is a relative movement between the two components. Photodetectors, which have a periodic structure and are fixedly connected with the second component, are furthermore provided. In this case the first one is a reflecting grating, and the second grating and the photodetectors are essentially located in one plane. The light source and the second grating can also be replaced by a structured light source, which generates the same image as a conventional light source and a grating. The structure of the photodetectors interacts with the image in such a way that a periodic change of the output signal from the photodetector occurs if a relative movement exists between the first and second components.

It is disadvantageous here that the individual components are discretely and separately provided. Because of this, a relatively large installation space is required for the entire arrangement.

It is known from DE 197 01 941 A1 that a scanning grating is arranged on the side of a transparent substrate facing a scale. The scanning grating is illuminated by a light source in such a way that an image of the grating is projected onto the scale. A second grating is located on the scale, which reflects the image onto a structured photodetector. In this case the transparent substrate for the first grating is connected with the semiconductor material from which the structured photodetector is made in such a way that the scanning grating and the photodetector are exclusively offset from each other in the measuring direction, but are at the same distance from the scale. In a second embodiment of DE 197 01 941 A1, the scanning grating is arranged on the side of the transparent substrate which is facing away from the scale. An optical chip, which contains the photodetector, is arranged on the same side of the same transparent substrate as the scanning grating. By means of this arrangement it is also achieved that the scanning grating and the structured photodetector have approximately the same distance from the scale.

In connection with the first embodiment there is the disadvantage that the transparent substrate to which the scanning grating is applied must be connected with the semiconductor material of which the structured photodetector is made. This connection must be performed very accurately, so that the structure of the photodetector is aligned parallel with the grating, and that the structure and the grating have the same distance from the scale. This exact connection between the substrate and the semiconductor material is therefore very difficult to provide. Furthermore, the second embodiment has the disadvantage that an optical chip must be fastened on the transparent substrate. Because of the attachment by means of a chip-on-glass technique, a space unavoidably exists between the optical chip and the substrate, because of which the distances between the transmitting grating and the scale, as well as between the photodetector and the scale, differ considerably, which results in a clear decrease of the optical properties of the arrangement.

It is known from DE 40 91 517 T1 to make a sensor for a measuring system out of a single block of semiconductor material. Here, photo elements designed as grating lines are provided on the surface of a flat-designed light-emitting diode, through which the light-emitting diode cannot radiate. A structured photodetector is created in this way, above or below of which a structured light source is arranged.

This sensor has the disadvantage that the photodetector structure and the structured light source unavoidably cannot have the same distance from a scale, since the light-emitting diode and the photodetector are placed on top of each other. This difference in the distance from the scale also clearly decreases the optical properties of the sensor.

It is known from EP 543 513 A1 to provide a structured photodetector, as well as a structured light source in the form of at least one light-emitting diode of a sensor on a common semiconductor layer of III/V semiconductor material, for example gallium arsenide GaAs. It is possible by means of providing the structured light source and the structured photodetector on a common semiconductor material to meet the requirement of providing the transmitting and receiving structures possibly in one plane very satisfactorily. Moreover, single field scanning takes place, wherein the photo elements are offset by $90°+k*360°$, where k is a whole number. Thus, several photo elements are arranged offset in the measuring direction by ninety degrees of angle plus whole-number multiples of three hundred sixty degrees of angle. Because of this, scanning becomes particularly insensitive to interferences.

The disadvantage here is that it is not described how the production of the structured photodetector and the structured light source on a common semiconductor material of GaAs takes place. If technique known from the prior art are used for producing the semiconductor, this manufacturing process is very elaborate and therefore expensive.

An optical sensor for a measuring system, having a light-receiving component and at least one optical component which acts on the light beam transmitted by the component emitting the light before it arrives at the component receiving the light, is known from EP 720 005 A2. This sensor has a spacer element, which defines the distance between the component emitting, or respectively receiving, light, and the optical components. In this case the spacer element is embodied in such a way that it is connected with another component. It is achieved by means of this that the optical sensor transmits and receives optical signals on one of its sides, because of which optical elements are arranged on this side, and has conductors for electrical signals on the other of its sides.

In connection with this it is disadvantageous that the component receiving light, the component transmitting light, the at least one optical component and the spacer element are all separate components, which must be produced and assembled separately. This is very expensive in view of the required accuracy of optical sensors in measuring systems. Moreover, the optical sensor is rather voluminous, since the individual components also must be separately handled.

An electronic hybrid component is known from DE 197 20 300 A1, wherein an implanted chip is placed in a chip-on-chip arrangement on a support substrate. To this end, the support substrate has at least one cavity, in which an electrical insulation layer with a metal layer on top of it is located. The chip implanted in the cavity is connected to the metal layer, because of which the latter is used as an electrical conductor. If the implanted chip is a light-emitting diode, the metallized layer can also be used for reflecting the radiation from the latter at the walls of the cavity.

This arrangement has the disadvantage that the direction of radiation from the light-emitting diode, as well as its electrical contacts, are arranged on one side of the semiconductor layer, or are emitted from this one side.

A radiation-sensitive detector element with an active area is known from DE 196 18 593 A1, wherein the active area is formed between two adjoining layer areas of a layer arrangement of different charge substrates, in which a conversion of incident electromagnetic radiation into electrical signals takes place. Here, the position of the active area in relation to the two bordering surfaces is selected, taking into account the penetration depth of the radiation, in such a way that at least two contact elements for connecting the detector element with an evaluation circuit can be mounted on a surface located opposite the radiation-sensitive surface on which the incident radiation strikes. The following process steps are employed in the course of the production method for such a detector element. An etch stop layer is created in a specifically doped semiconductor layer closely below a limiting first surface. This is followed by a spatially selective removal by etching of the substrate present underneath the etch stop layer until the etch stop layer forms a limiting second surface. Thereafter, a spatially limited layer area is created above the etch stop layer, which is doped differently from the semiconductor layer, and the detector element is connected to a side opposite the second surface by means of at least two contact elements.

The disadvantage here is that only a photodiode is disclosed here, but not a complete optoelectronic sensor.

A scanning head for a scale with a graduation is known from DE 198 59 670.7, wherein the scanning head essentially includes a single semiconductor layer having several structured photodetectors on the side facing the scale, which furthermore has a blind bore which is bordered by transmitting grating on the side facing the scale. In this case the transmitting grating is formed in a layer placed on the semiconductor layer, or by a special embodiment of the process for drilling the blind bore. A light source is moreover arranged in the blind bore, which radiates in the direction toward the transmitting grating.

It is disadvantageous here that a relatively large distance exists between the transmitting grating and the light source. It is also disadvantageous that the photodetectors are connected to the side facing the scale.

An integrated optoelectronic sensor for scanning a graduation is known from DE 198 59 669.3. The sensor includes a single semiconductor layer, which has several detectors on the side facing away from the graduation. The semiconductor material has been at least partially removed in the area of the photodetectors, so that light can enter into the light-detecting area of the photodetectors from the side of the sensor facing the graduation. The sensor has a light source on the side facing away from the graduation, in whose area the entire thickness of the opaque components is disrupted, so that the light source radiates through the sensor. On the side facing the graduation, the semiconductor layer is connected with a transparent substrate member having at least one further graduation, by which the radiation from the light source is optically affected.

It is disadvantageous here that the at least one graduation applied to the substrate member in the area of the photodetectors is relatively far away from the photodetectors, and in the area of the light source relatively far away from the light source. The optical properties are worsened by this. A further disadvantage lies in that during the production it is necessary to remove semiconductor material in the area of the photodetectors in a special method step.

SUMMARY AND OBJECTS OF THE INVENTION

It is therefore an object of the present invention to disclose an integrated optoelectronic sensor and a method for producing it, wherein the distance between the optical gratings and the photodiodes, as well as the light source, is as short as possible. In this case the production method for the integrated optoelectronic sensor should be as cost-effective as possible.

This object is attained by a measuring system that includes a scale and a transparent substrate located opposite the scale. The transparent substrate includes a graduation structure and a semiconductor layer arranged on a first side of the transparent substrate facing away from the scale, wherein a photodetector, a light source and an electronic circuit are integrated into the semiconductor layer.

The sensor of the present invention has the advantage that the semiconductor layer in which the photodetectors are formed is designed to be very thin. Because of this the distance between the gratings applied to the substrate and the photodetectors, as well as the between the light source and the photodetectors, is very short. The optical properties of the sensor are improved by this. A further advantage lies in that no special process steps are required for reducing the thickness of the semiconductor layer in the area of the photodetectors. The semiconductor layer is already so thin that the detecting areas of the photodetectors extend as far as the boundary with the substrate.

Further advantages, as well as details of the sensor in accordance with the present invention and of the method in accordance with the present invention ensue from the following description of an exemplary embodiment by means of the drawings. Shown are in:

BRIEF DESCRIPTION OF THE DRAWINGS

FIG. 8 schematically shows a process sequence of an embodiment of a method in accordance with the present invention;

FIG. 9 schematically shows a process sequence of a second embodiment of a method in accordance with the present invention; and FIG. 10 schematically shows a process sequence of a third embodiment of a method in accordance with the present invention.

DESCRIPTION OF THE PREFERRED EMBODIMENT(S) OF THE INVENTION

The sensor in accordance with the present invention will be explained in what follows by an exemplary embodiment containing a linear measuring system. However, without any essential changes, there is the option to also employ the thin-film sensor in accordance with the present invention in connection with an angle measuring system or a two-dimensional measuring system.

Figure 1:
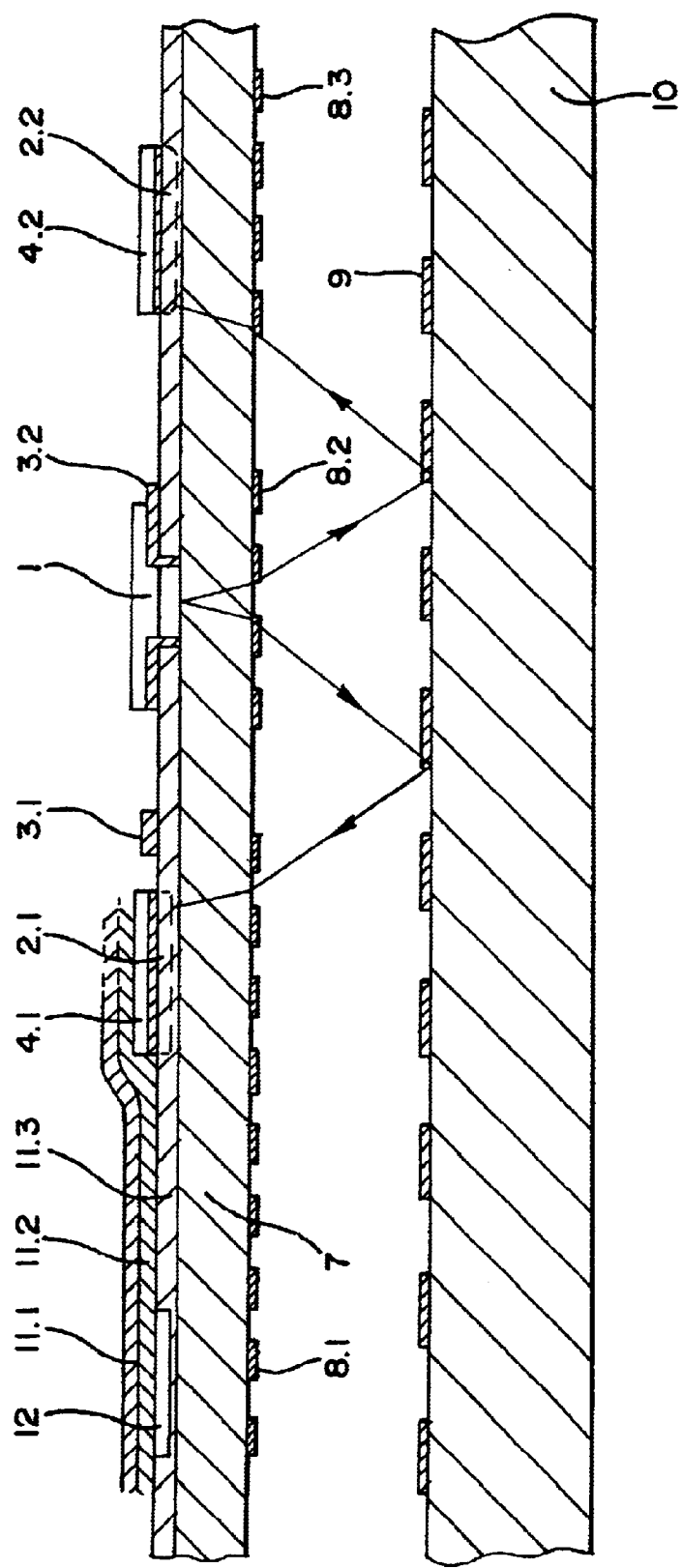
FIG. 1 schematically shows a cross-sectional view of an embodiment of a measurement system according to the present invention that uses an embodiment of a thin-film sensor in accordance with the present invention.

The optoelectronic thin-film sensor and a scale 10 are schematically represented in FIG. 1. The thin-film sensor includes a thin semiconductor layer 11.3, preferably made of silicon, into which photodetectors 2.1 and 2.2 have been integrated. Passivation layers 11.1 and 11.2 including be silicon oxide and/or silicon nitride are arranged on the side of the semiconductor layer 11.3 facing away from the scale 10. The photodiodes 2.1 and 2.2 are created directly in the semiconductor layer 11.3, which forms the thin-film sensor in accordance with the present invention. The two photodiodes 2.1 and 2.2 each merely symbolize a functional component, which can contain several photodiodes, or also several wired-together groups of photodiodes, for example for single field scanning. The photodiodes 2.1 and 2.2 can moreover be embodied to be structured.

These functional components of photodiodes 2.1 and 2.2 are arranged symmetrically with respect to a radiation source 1 for electromagnetic radiation, in particular light, which is preferably provided in the form of a light-emitting diode. In this case the light-emitting diode 1 can be connected with the semiconductor layer 11.3 in the form of a separate component, as represented in the drawing figure. Alternatively, the photodiodes 2.1 and 2.2 can also be formed in the semiconductor layer 11.3. In that case a light-emitting diode 1 is produced by appropriate doping in a semiconductor layer 11.3 made of a suitable semiconductor material, for example gallium arsenide.

Alternatively the light-emitting diode 1 can also be provided as an organic or inorganic polymer film. The latter is then applied directly to the substrate 7. The contacts 3.2 for the light-emitting diode 1 then must be conducted to the polymer film from the side of the semiconductor layer 11.3 facing away from the scale 10.

However, in accordance with the drawing figure, a separate SMD (Surface Mounted Device) component is advantageously preferred for the light-emitting diode. So that the radiation from the light-emitting diode 1, which is arranged on the same side of the semiconductor layer 11.3 as the photodiodes 2.1 and 2.2, can reach the other side of the semiconductor layer 11.3, the semiconductor layer 11.3 is completely etched through at this location, for example by anisotropic etching.

Further electrical components are moreover integrated in the side of the semiconductor layer 11.3 facing away from the scale 10. Complex semiconductor circuits 12 are integrated in this common semiconductor layer 11.3, besides electrical conductors. These preferably are low-noise amplifiers 12 for the output signals of the photodiode components 2.1 and 2.2, as well as an interpolation component 12 for the output signals of the low-noise amplifiers 12.

Figure 7:
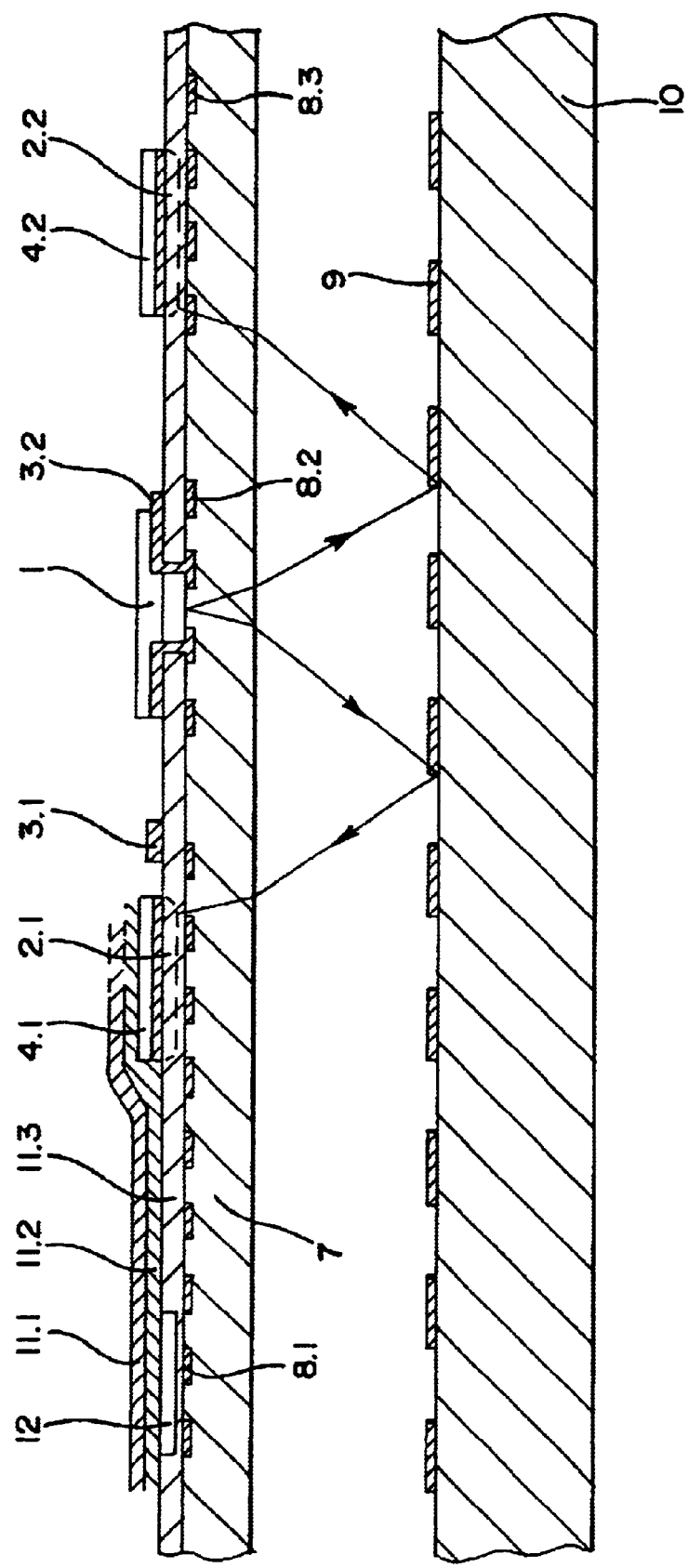
FIG. 7 schematically shows a cross-sectional view of a seventh embodiment of a measurement system according to the present invention that uses a seventh embodiment of a thin-film sensor in accordance with the present invention.

On the side facing the scale 10, the semiconductor layer 11.3 is connected with a substrate 7, which is transparent to the radiation emitted by the light-emitting diode 1. This connection can be made by gluing, thermal and/or anodic bonding. This transparent substrate 7 has one or several graduations 8.1, 8.2 and 8.3, whose actual structure and grating constant is a function of the measuring system to be created. These graduations 8.1, 8.2 and 8.3 are preferably applied to the side of the substrate 7 facing the scale, as represented in FIG. 1. Alternatively, an arrangement of the graduations 8.1, 8.2 and 8.3 is also possible on the other side of the substrate 7, as represented in FIG. 7. Here, the graduations 8.1, 8.2 and 8.3 can also be put into the surface of the substrate 7, if previously corresponding depressions in the substrate 7 had been provided for the graduations 8.1, 8.2 and 8.3, as represented in FIG. 7.

The optoelectronic thin-film sensor constructed as represented in FIGS. 1 and 7 is arranged opposite a scale 10, which has a graduation 9. If the light-emitting diode transmits a light beam in the direction of the scale 10, this light beam is initially diffracted at the graduation 8.2, then impinges on the graduation 9 of the scale 10, is again diffracted there and further diffracted at the graduations 8.1 and 8.3, before the light beam impinges on the photodiodes 2.1 and 2.2, by means of which the intensity of the light beam is detected. The output signal of the photodiodes 2.1 and 2.2 is provided to at least one amplifier 12, and the output signal of the latter to at least one interpolator 12, wherein all these components can be integrated into the semiconductor layer 11.3, or can be separately provided.

In order to be able to perform the electrical wiring on one level, the photoelectric elements 2.1 and 2.2 are provided on the surface of the semiconductor layer 11.3 facing away from the scale 10, as represented in FIGS. 1 and 7. The thickness of the active layer of the photodetectors 2.1 and 2.2 can be optimized depending on the wavelength, for example 25 μm thickness of the active area of the photodiodes 2.1 and 2.2 at a wavelength of the magnetic radiation radiated by the light-emitting diode 1 of 860 nm. This thickness required for the photo elements 2.1 and 2.2 determines the entire thickness of the semiconductor layer 11.3.

To achieve an increase of the sensitivity of the photo elements 2.1 and 2.2, a reflector 4.1 and 4.2 can be applied to the surface of the photo elements 2.1 and 2.2 underneath the passivation layer 11.2. It includes, for example, of aluminum and is applied to the photo elements 2.1 and 2.2 by sputtering techniques. If this reflector 4.1 and 4.2 is conductive, it can also be used as an electrical connector for the photodiodes 2.1 and 2.2. Otherwise exiting light beams are again reflected into the active area of the photodiodes 2.1 and 2.2 by the reflector 4.1 and 4.2, and the photoelectric current is increased by this. Moreover, structuring of the contacts of the photodiodes 2.1 and 2.2 is possible. By this they can be distributed over the entire surface of the photodiodes 2.1 and 2.2. For this purpose the contacts have a meander-shaped or finger-shaped structure. This causes a locally homogeneous sensitivity over the entire surface of the photo elements 2.1 and 2.2.

In addition, the reflection from the side facing the direction of entry of the light, i.e. the underside of the substrate 7, can be reduced by further layers of SiO2 and/or $Si_3N_4$. In this case the layer thickness of this reflection-reducing layer is selected as a function of the wavelength of the radiation transmitted by the light-emitting diode 1.

The light source, for example a light-emitting diode 1, is integrated and electrically connected on the same level as the photodiodes 2.1 and 2.2 and the amplification and interpolating unit 12, as represented in FIGS. 1 and 7. For this purpose, an opening is cut which completely penetrates the semiconductor layer 11.3. The light-emitting diode 1 is equipped as an SMD unit from above. There is the alternative possibility of providing a substrate member 1.2 for the light-emitting diode 1 in order to vary the radiation plane of the light-emitting diode 1 in height, as represented in FIG. 4.

It is alternatively also possible to attach and connect the light-emitting diode 1 to the substrate 7. The opening cut into the semiconductor layer 11.3 must be correspondingly of sufficient size. The strip conductors for connecting the light-emitting diode are then either all arranged on the substrate 7, or they initially extend on the side of the then perpendicularly with respect to it along the thickness of the semiconductor layer as far as the substrate 10 for contacting the light-emitting diode 1 arranged there.

A further alternative for producing a light-emitting diode 1 includes integrating a porous semiconductor structure into the semiconductor layer 11.3, for example by an anodic etching process by hydrofluoric acid. Appropriate PN junctions are furthermore arranged by doping in the area of the porous semiconductor structure, so that a light-emitting diode 1 is created.

Figure 4:
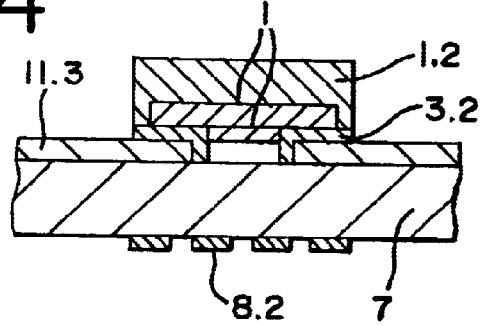
FIG. 4 schematically shows a cross-sectional view of a portion of a fourth embodiment of a measurement system according to the present invention that uses a fourth embodiment of a thin-film sensor in accordance with the present invention.

A housing made of silicon, or in particular of gallium arsenide GaAs can be used as the substrate member 1.2 of the light-emitting diode 1, as represented in FIG. 4. It is assured by this that the substrate member 1.2 has the same expansion coefficient as the light-emitting diode 1, which as a rule is made of GaAs. When using the mentioned materials as the substrate member 1.2 for the light-emitting diode 1 it is also assured that a good heat sink for the light-emitting diode 1 is created because of the good heat conductivity of the substrate member 1.2. This has positive effects regarding the service life and output of the light-emitting diode 1. The back of the substrate member 1.2 of the light-emitting diode 1 can be protected against entering heat radiation by a ceramic shield, outgoing heat radiation can also be prevented by this.

Figure 2:
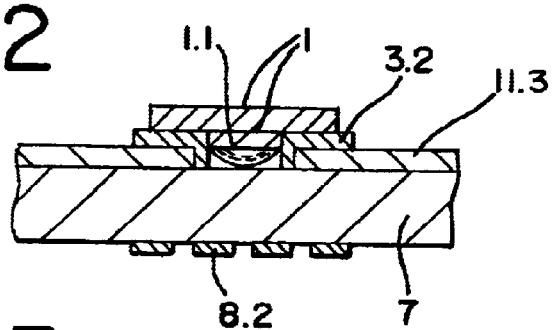
FIG. 2 schematically shows a cross-sectional view of a portion of a second embodiment of a measurement system according to the present invention that uses a second embodiment of a thin-film sensor in accordance with the present invention.

The substrate member 1.2 of the light-emitting diode 1 is simultaneously used as the electric contact for equipping the surface of the semiconductor layer 11.3 with SMD and for providing the light-emitting diode 1 itself with contacts. A lens 1.1 for affecting the course of the light can be attached to the radiating surface of the light-emitting diode 1, as represented in FIG. 2.

Because all electrical connections for the light-emitting diode 1, the photo elements 2.1 and 2.2, as well as the amplification and interpolating unit 12, are located in one plane, the electrical connecting lines 3.1 to the processing components 12 for the output signals of the optoelectronic components 2.1, 2.2 can be embodied to be simple. The preferred technique for integrating the amplification and interpolating unit 12 is a technological process compatible with CMOS.

The entire surface of the contacting plane can be covered by means of passivation layers 11.1 and 11.2, for example of $SiO_2$ and $Si_3N_4$ which, the same as the semiconductor layer 11.3, are applied in accordance with a CVD (chemical vapor disposition) process.

A preferred material for the semiconductor layer 11.3 is silicon with a crystal orientation (1-0-0). Silicon of this orientation is also preferred for a CMOS integration of the amplification and interpolating unit 12.

The substrate 7, which is arranged on the side of the semiconductor layer 11.3 facing the scale 10, supports the grating structures 8.1, 8.2 and 8.3 required for the optical effect, as symbolically represented in FIGS. 1 and 7. The grating structures 8.1, 8.2 and 8.3 can be embodied as phase gratings and/or as amplitude gratings in the form of chromium gratings. The grating structures 8.1, 8.2 and 8.3 are preferably applied to the side facing away from the semiconductor layer 11.3. However, it is also possible that the grating structures 8.1, 8.2 and 8.3 are applied on the side of the substrate 7 facing the semiconductor layer 11.3, as represented in FIG. 7. It is then possible to use an underfiller for achieving an optimal connection between the substrate 7 and the semiconductor layer 11.3. But to avoid an underfiller it is also possible to first apply the grating structures 8.1, 8.2 and 8.3 to the substrate 7, and thereafter the semiconductor layer 11.3 over the grating structures 8.1, 8.2 and 8.3. In a further alternative it is also possible to provide depressions of the thickness of the grating structures 8.1, 8.2 and 8.3 in the substrate 7, into which the grating structures 8.1, 8.2 and 8.3 are placed, so that the substrate 7, including the grating structures, forms a level surface for applying the semiconductor layer 11.3.

Figure 6:
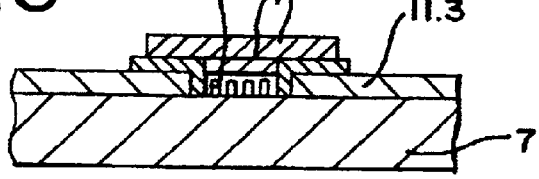
FIG. 6 schematically shows a cross-sectional view of a portion of a sixth embodiment of a measurement system according to the present invention that uses a sixth embodiment of a thin-film sensor in accordance with the present invention.

If the grating structure 8.2 for the light-emitting diode 1 is intended to be applied on the side of the substrate 7 facing away from the scale 10, this can be accomplished in that, during etching of the opening for the light-emitting diode 1, strips of semiconductor material remain in the area of the substrate 7 and form a grating structure 8.2 with the desired optical effects, as represented in FIG. 6.

In an alternative embodiment, the substrate 7 can have respectively one grating structure on its side facing away from the scale 10, as well as on the side facing the scale 10. These at least two grating structures applied to either side of the substrate 7 can there be provided in the form of phase gratings, as well as amplitude gratings, as well as a combination of phase and amplitude gratings. Structuring of the phase grating there can be arranged not only parallel with the grating lines of the graduation 9 on the scale 10, but can also be selected to be perpendicular to it. More areas on the graduation 9 are simultaneously scanned by such an azimuthal arrangement of the grating structures, so that the sensitivity to contamination is reduced.

Figure 3:
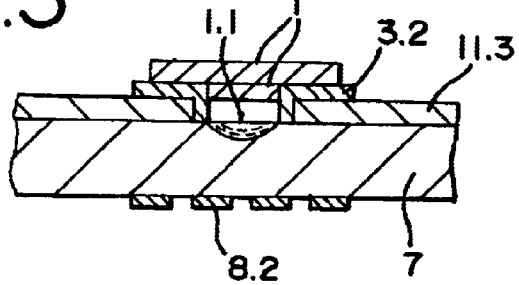
FIG. 3 schematically shows a cross-sectional view of a portion of a third embodiment of a measurement system according to the present invention that uses a third embodiment of a thin-film sensor in accordance with the present invention.

A further alternative is the insertion of a lens 1.1 into the substrate 7 underneath the radiating level of the light-emitting diode 1, as represented in FIG. 3. Because of the silicon opening, it is possible to attach the lens 1.1 to the substrate 7 on the side facing and/or facing away from the scale 10. Such a lens 1.1. is technologically produced by electron lithography in a PMMA resist, for example. The curvature of the lens 1.1 in the resist is created by different radiation doses in the resist, the resist structure is then transferred to the substrate 7 by plasma etching. With this technology it is also possible to impress a structure, i.e. a phase grating 8.2, for example, on the lens 1.1 itself. The method step for inserting an optical lens 1.1 into the substrate 7 can already take place prior to the deposition of the semiconductor layer 11.3.

The substrate 7 can advantageously be made of Pyrex material having the same longitudinal expansion coefficient as silicon. This reduces tensions, increases the mechanical stability in the silicon and therefore prevents offset lines in the silicon, which can lead to electrical interference. Sapphire and suitable borosilicate glasses are other material suitable for the substrate 7.

The measuring system with which the sensor in accordance with the present invention is used can be a one-dimensional measuring system, such as a linear or angle measuring system, as well as a two-dimensional measuring system, such as a cross-grating measuring system, which has a cross-grating or checkerboard grating as the scale. The scanning system required for this has either two sensors in accordance with the invention, which are advantageously arranged orthogonally with respect to each other. It is alternatively also possible to integrate in a sensor two groups of photo elements with one-dimensional structures, whose orientation corresponds to the measuring directions, or which are arranged orthogonally with respect to each other. In this case the transmitting grating is designed as a two-dimensional grating, for example a cross-grating or checkerboard grating, and is therefore required only once.

Figure 5:
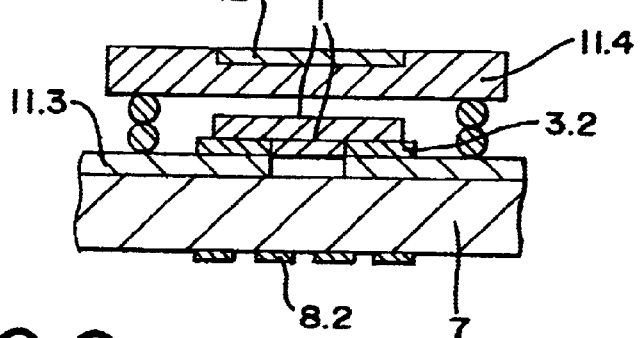
FIG. 5 schematically shows a cross-sectional view of a portion of a fifth embodiment of a measurement system according to the present invention that uses a fifth embodiment of a thin-film sensor in accordance with the resent invention.

To achieve a more compact structure of the entire sensor it is also possible in accordance with the present invention to integrate the further electronic circuits 12 in a separate semiconductor layer 11.4, which is spatially arranged above the semiconductor layer 11.3 with the optoelectronic components, as represented in FIG. 5. Since in accordance with the present invention the electrical contacts are already exclusively arranged on the top of the semiconductor layer 11.3 with the optoelectronic components, contacting in chip-on-chip technology with the semiconductor layer 11.4 arranged above it is possible in a very simple manner. It is possible by means of this to considerably shorten the length of connecting lines between the optoelectronic and electronic components, which leads to increased interference resistance and allows faster signal processing because of a higher clock rate.

It is obvious to one skilled in the art that the characteristics of the sensor in accordance with the present invention, which have been described by means of different exemplary embodiments, can be arbitrarily combined with each other.

The individual method steps for producing the sensor of the invention in accordance with FIGS. 8, 9 and 10, which represent three different ways of proceeding and which have partially already been mentioned, will be described in greater detail in what follows.

The production method essentially consists of three areas: processing of the substrate 7, processing of the semiconductor layer 11.3, and combination of the two parts. The substrate 7 and the semiconductor layer 11.3 can basically be processed separately from each other, but also when they are already connected with each other.

Thus, there is the option that the substrate 7 is initially processed and either the already finished semiconductor layer 11.3 is subsequently applied, or the semiconductor layer is further processed after connection with the substrate 7. Alternatively with this, the semiconductor layer 11.3, possibly already finished, can be first applied to the substrate 7, and the substrate 7—and possibly the semiconductor layer 11.3—can be then finished. It is essentially possibly to freely select the sequence of processing the substrate 7, the semiconductor layer 11.3 and their connection with each other, from which several alternative process sequences result. The only limitation is that no further grating structures 8.1, 8.2 and 8.3 can be applied to the side of the substrate 7 facing away from the scale 10 after the semiconductor layer 11.3 has been connected with the side of the substrate 7 facing away from the scale 10.

In a method in accordance with the present invention for producing a semiconductor layer 11.3, a semiconductor material, preferably silicon, is applied in the desired thickness to the side of the substrate 7 facing away from the scale 10. This can be done by a CVD process or other processes known from the prior art. In the course of this a crystalline, poly-crystalline, amorphous, porous, micro- or nano-crystalline semiconductor layer 11.3 is deposited. Alternatively to this it is possible to process the semiconductor layer 11.3 first on a wafer, instead of the substrate 7, and to connect it only later with the substrate 7.

In connection with a further alternative, the semiconductor layer 11.3 can also be sputtered on and subsequently melted by means of a laser, so that the required semiconductor layer 11.3 is formed after the semiconductor material has become cold.

In accordance with another alternative, the semiconductor material can be reduced to a thickness of approximately 30 $\mu$m by mechanical action, and can be subsequently chemically lapped. This thin semiconductor layer 11.3 is thereafter connected with the substrate 7, for example by a bonding method.

In a second step the photodiodes 2.1 and 2.2 are created by appropriate doping of the areas in which the photodetectors are to be arranged. The creation of the further components, such as the amplification and interpolating unit 12, can also take place in this step, if they are intended for the same semiconductor layer 11.3.

The strip conductors 3.1 and the contacts 3.2, as well as metallic layers 4.1 and 4.2 on the backs of the photodiodes 2.1 and 2.2, are applied in a third step. This takes place by applying a metallizing layer of aluminum titanium oxide, which is appropriately structured by known photochemical processes, to the semiconductor layer 11.3.

In the next step the light-emitting diode 1, possibly with a housing made of semiconductor material and with a shield of a ceramic material, is connected in an electrically conducting manner with the contact points 3.2. If a polymeric light-emitting diode 1 is used, it is connected later, after the connection of the substrate 7 with the semiconductor layer 11.3.

If the further components, such as the amplification and interpolating unit 12, are not provided next to the optoelectronic components 1, 2.1, 2.2, etc., it is possible thereafter to connect an additional semiconductor layer 11.4, in which the additional components 12 have been provided, from above with the semiconductor layer 11.3. This connection can be performed by chip-on-chip technology, so that the two semiconductor layers 11.3 and 1.4 are connected with each other in an electrically conducting manner.

In connection with the method of the present invention for producing the substrate 7, there is the option of integrating a lens 1.1, which collimates the light from the light-emitting diode 1, in the substrate 7. To do this, a pattern of the lens is formed in a PMMA resist by electron beam lithography. In this case the dose during the exposure to electrons is changed in such a way that the shape of a lens 1.1 results after the development process. This is transferred into the material of the substrate 7, for example by a plasma etching process.

Subsequently the grating structures 8.1, 8.2 and 8.3 are applied to the substrate 7. It is possible to create phase gratings on the substrate 7 in the same way as just described in connection with the lens. Amplitude gratings are applied to the substrate 7 in accordance with known processes, for example in the form of chromium gratings.

The connection of the substrate 7 and the semiconductor layer 11.3 in accordance with FIGS. 8, 9 and 10 can take place at any arbitrary time. It is advantageous to make the connection when processing of the substrate 7 and the semiconductor layer 11.3 is finished, since in that case the substrate 7 and the semiconductor layer 11.3 can be processed separately, as represented in FIG. 8. Alternatively it can then be advantageous to deposit the semiconductor layer 11.3 directly on the substrate 7, which can take place at any arbitrary processing stage.

Alternatively there is the option of depositing semiconductor material on the substrate 7 only at those points where semiconductor components of the sensor are also intended to be. This is achieved in that, as already described, the semiconductor material is arranged as a semiconductor layer 11.3 on the entire side of the substrate 7 which faces away from the scale 10, and that thereafter the unneeded semiconductor material is removed again by lithographic processes. Alternatively to this it is also possible to apply semiconductor material selectively to the substrate 7 only where semiconductor components are intended to be.

It is obvious to one skilled in the art that it is possible to combine the cited method steps to a large extent arbitrarily with each other and therefore result in a multitude of combination options, which cannot all be exhaustively described.

The invention may be embodied in other forms than those specifically disclosed herein without departing from its spirit or essential characteristics. The described embodiments are to be considered in all respects only as illustrative and not restrictive, and the scope of the invention is commensurate with the appended claims rather than the foregoing description.

We claim:

1. A measuring system, comprising:
a scale;
a transparent substrate located opposite said scale, wherein said transparent substrate comprises:
a graduation structure;
a semiconductor layer arranged on a first side of said transparent substrate facing away from said scale, wherein a photodetector, a light source and an electronic circuit are integrated into said semiconductor layer, wherein a layer, which reflects radiation emitted from said light source, is provided on a side of said photodetector facing away from said scale.

2. The measuring system of claim 1, wherein said semiconductor layer is made of silicon.

3. The measuring system of claim 1, wherein a second photodetector is integrated into said semiconductor layer so that said photodetector and said second photodetector are arranged symmetrically in relation to said light source.

4. The measuring system of claim 1, wherein said light source emits radiation divergently.

5. The measuring system of claim 1, further comprising a passivating layer of silicon oxide is provided on top of said side of said semiconductor layer facing away from said scale.

6. The measuring system of claim 1, further comprising a passivating layer of silicon nitride is provided on top of said side of said semiconductor layer facing away from said scale.

7. The measuring system of claim 1, further comprising a reflection-reducing layer provided on a side of said transparent substrate facing away from said scale.

8. The measuring system of claim 1, wherein said transparent substrate has a thermal elongation coefficient similar to that of said semiconductor layer.

9. The measuring system of claim 1, wherein said transparent substrate is made of a borosilicate glass.

10. The measuring system of claim 1, wherein said transparent substrate is made of sapphire.

11. The measuring system of claim 1, wherein an electrical conductor and an electrical contact are arranged on a side of said semiconductor layer facing away from said scale.

12. The measuring system of claim 1, wherein said graduation structure comprises an amplitude grating.

13. The measuring system of claim 1, wherein said graduation structure comprises a phase grating.

14. The measuring system of claim 1, wherein said light source comprises:
a light-emitting diode; and
a lens integrated into said transparent substrate.

15. The measuring system of claim 1, wherein said light source is locally provided by a pn junction in a porous portion of said semiconductor layer.

16. A measuring system, comprising:
a scale;
a transparent substrate located opposite said scale, wherein said transparent substrate comprises:
a graduation structure;
a semiconductor layer arranged on a first side of said transparent substrate facing away from said scale, wherein a photodetector, a light source and an electronic circuit are integrated into said semiconductor layer, wherein said light source comprises:
a light-emitting diode; and
a lens integrated into said transparent substrate.

17. A measuring system, comprising:
a scale;
a transparent substrate located opposite said scale, wherein said transparent substrate comprises:
a graduation structure;
a semiconductor layer arranged on a first side of said transparent substrate facing away from said scale, wherein a photodetector, a light source and an electronic circuit are integrated into said semiconductor layer, wherein said light source is locally provided by a pn junction in a porous portion of said semiconductor layer.

18. A measuring system, comprising:

a scale;

a transparent substrate located opposite said scale, wherein said transparent substrate comprises:
  a graduation structure;
  a light source;
  a semiconductor layer arranged on a first side of said transparent substrate facing away from said scale, wherein a photodetector and an electronic circuit are integrated into said semiconductor layer, and wherein a layer which reflects radiation from said light source is provided on a side of said photodetector facing away from said scale.

19. The measuring system of claim 18, wherein said semiconductor layer is made of silicon.

20. The measuring system of claim 18, wherein said light source emits radiation divergently.

21. The measuring system of claim 18, further comprising a passivating layer of silicon oxide is provided on top of said side of said semiconductor layer facing away from said scale.

22. The measuring system of claim 18, further comprising a passivating layer of silicon nitride is provided on top of said side of said semiconductor layer facing away from said scale.

23. The measuring system of claim 18, further comprising a reflection-reducing layer provided on a side of said transparent substrate facing away from said scale.

24. The measuring system of claim 18, wherein said transparent substrate has a thermal elongation coefficient similar to that of said semiconductor layer.

25. The measuring system of claim 18, wherein said transparent substrate is made of a borosilicate glass.

26. The measuring system of claim 18, wherein said transparent substrate is made of sapphire.

27. The measuring system of claim 18, wherein an electrical conductor and an electrical contact are arranged on a side of said semiconductor layer facing away from said scale.

28. The measuring system of claim 18, wherein said graduation structure comprises an amplitude grating.

29. The measuring system of claim 18, wherein said graduation structure comprises a phase grating.

* * * * *

UNITED STATES PATENT AND TRADEMARK OFFICE
CERTIFICATE OF CORRECTION

PATENT NO. : 6,621,104 B1 Page 1 of 1
DATED : September 16, 2003
INVENTOR(S) : Peter Speckbacher et al.

It is certified that error appears in the above-identified patent and that said Letters Patent is hereby corrected as shown below:

Title page,
Item [57], ABSTRACT,
Line 3, before "includes a" insert -- substrate --.

Signed and Sealed this

Twenty-seventh Day of July, 2004

JON W. DUDAS
*Acting Director of the United States Patent and Trademark Office*